(12) United States Patent
Bell et al.

(10) Patent No.: US 6,563,221 B1
(45) Date of Patent: May 13, 2003

(54) CONNECTION STRUCTURES FOR INTEGRATED CIRCUITS AND PROCESSES FOR THEIR FORMATION

(75) Inventors: Scott A. Bell, San Jose, CA (US); Todd P. Lukanc, San Jose, CA (US); Christopher F. Lyons, Fremont, CA (US); Marina V. Plat, San Jose, CA (US); Ramkumar Subramanian, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/081,982

(22) Filed: Feb. 21, 2002

(51) Int. Cl.[7] ................................................ H01L 23/48
(52) U.S. Cl. .................. 257/758; 257/774; 257/750; 257/762; 257/771; 257/773
(58) Field of Search ................................. 257/774, 750, 257/758, 762, 771, 773

(56) References Cited

U.S. PATENT DOCUMENTS

| | | | |
|---|---|---|---|
| 5,614,756 A | * 3/1997 | Forouhi et al. | ............. 257/530 |
| 5,616,924 A | * 4/1997 | Dennison et al. | ........... 257/774 |
| 6,127,734 A | * 10/2000 | Kimura | ...................... 257/774 |
| 6,133,636 A | * 10/2000 | Akram et al. | ................. 257/761 |
| 6,333,548 B1 | * 12/2001 | Yamane et al. | ............... 257/652 |
| 6,191,027 B1 | * 2/2002 | Omura | ........................ 438/638 |
| 6,368,952 B1 | * 4/2002 | Liang et al. | ................. 438/622 |
| 6,255,732 B1 | * 7/2002 | Yokoyama et al. | ......... 257/760 |

* cited by examiner

Primary Examiner—Jasmine J B Clark
(74) Attorney, Agent, or Firm—Foley & Lardner

(57) ABSTRACT

In a method for forming a connection structure in an integrated circuit, a first conducting material is deposited over a substrate and patterned to form a conducting stud in electrical contact with a conducting element of the substrate. A dielectric is formed over the substrate and the conducting stud. A trench is formed in the dielectric to expose a top portion of the conducting stud, and a second conducting material is inlaid in the trench to form wiring in electrical contact with the conducting stud. The electrically conducting element of the substrate may be an element of a semiconductor device or a wiring, contact or via. The first conducting material may be aluminum, and the second conducting material may be copper. The dielectric may be formed as a single layer and may be an organic low-k dielectric. Related connection structures are also disclosed.

17 Claims, 8 Drawing Sheets

Copper wiring and contact structure retaining the oxide hard mask

Prior Art copper contact and wiring

Deposition of organic low-k dielectric over gate electrode followed by planarization to expose gate electrode Deposition of aluminum in contact with the gate electrode Etching aluminum to form contact stud Deposition of organic low-k dielectric over aluminum stud and planarization Etching of damascene trench in low-k dielectric to expose aluminum stud Formation of protective layer in the trench Formation of copper seed layer in the trench Deposition of copper in the trench Etching of the low-k dielectric using a hard mask Copper wiring and contact structure retaining the oxide hard mask

CONNECTION STRUCTURES FOR INTEGRATED CIRCUITS AND PROCESSES FOR THEIR FORMATION

FIELD OF THE INVENTION

The invention pertains to connection structures for integrated circuits, and has particular application to integrated circuits employing copper interconnection networks.

BACKGROUND OF THE INVENTION

Integrated circuits (ICs) are manufactured by forming discrete semiconductor devices such as MOSFETS and bipolar junction transistors on the surface of a silicon wafer, and then forming a metal interconnection network in contact with the devices to create circuits. The metal interconnection network is composed of horizontal layers of individual metal wirings. The metal wirings are connected to devices on the wafer by vertical contacts, and are connected to other metal wirings by vertical vias. A typical interconnection network employs multiple levels of wiring and vias.

Wiring may be formed through a conventional patterning process by patterning wires from a layer of metal, and then depositing an insulating material over the wiring. Alternatively, wiring may be formed through a damascene process by depositing an insulating layer, patterning and etching voids in the insulating layer, and then depositing metal into the voids. Contacts and vias are conventionally formed using a damascene process. Typically wiring layers are formed separately from contacts and vias in separate insulating layers, or are formed together in a single damascene process.

The performance of integrated circuits is determined in large part by the conductance and capacitance of the metal interconnection network. Conventional interconnection networks used metals such as tungsten and titanium to form wiring, vias and contacts. In recent years copper has become a preferred metal for interconnection networks because of its low resistivity compared to other conventional metals. However, copper has properties that are disadvantageous compared to the conventional metals. For example, copper migrates easily through insulating materials during processing, thus requiring the use of a layer of a protective material such as SiN to inhibit migration. Deposition of copper is also more difficult than deposition of conventional metals because it is necessary to form a copper seed layer using physical vapor deposition, followed by bulk deposition of copper by electroplating.

FIG. 1 shows an example of a conventional copper contact and wiring structure formed together in a damascene process. In this example, a MOSFET gate structure consisting of a gate electrode 14, gate insulating layer 12 and insulating side walls 16 is formed on a substrate 10. A copper structure 22 comprising a contact portion 22a and a wiring portion 22b is formed in contact with the gate electrode 14 through a damascene process. Surrounding the copper structure 22 is a copper seed layer 20, and surrounding the seed layer 20 is a protective layer 18.

Formation of the structure of FIG. 1 is more complex than formation of contacts and wiring using conventional metals since it is necessary to form barrier and seed layers within the space for the contact before bulk copper can be deposited. Thus the barrier and seed layers reduce the amount of space that can be occupied by the copper contact. Where design rules are small, these layers may leave virtually no room for the copper contact.

SUMMARY OF THE INVENTION

Preferred embodiments of the invention address the foregoing shortcomings of the conventional technology by providing a hybrid connection structure comprising a patterned contact or via and a damascene wiring. The hybrid connection structure is formed through a hybrid process whereby a single layer of insulating material is deposited around patterned contacts or vias and further serves as the substrate in which wiring is inlaid in contact with the contacts or vias. Unlike conventional technology, methods in accordance with the preferred embodiment utilize a patterned conductor as a contact or via. In accordance with preferred embodiments, the wiring is formed of copper, and the contact or via is formed of aluminum. The use of patterned aluminum overcomes the inability of conventional technologies to use aluminum as a contact or via conductor material in narrow design rule structures because of its poor damascene filling properties. The use of patterned aluminum further avoids the disadvantages entailed in forming a narrow copper contact or via.

Accordingly, embodiments of the invention pertain to a method for forming a connection structure in an integrated circuit. A first conducting material is deposited in contact with a substrate and patterned to form a conducting stud in electrical contact with a conducting element of the substrate. A single layer of dielectric is formed over the substrate and the conducting stud. A trench is formed in the dielectric to expose a top portion of the conducting stud, and a second conducting material is inlaid in the trench in electrical contact with the conducting stud to form a wiring. The electrically conducting element of the substrate may be a wiring or an element of a semiconductor device. The first conducting material may be aluminum, the second conducting material may be copper, and the dielectric may be an organic low-k dielectric.

Related embodiments of the invention pertain to an interconnection structure for an integrated circuit. The structure comprises a substrate that includes a conducting element, and a single layer of dielectric formed over the substrate. A conductive stud is disposed within the layer of dielectric in electrical contact with the conducting element. A conductive material is inlaid in a trench in the dielectric in electrical contact with the conductive stud to form a wiring. The electrically conducting element of the substrate may be a wiring or an element of a semiconductor device. The first conducting material may be aluminum, the second conducting material may be copper, and the dielectric may be an organic low-k dielectric.

Further embodiments of the invention pertain to a method for forming an interconnection structure for an integrated circuit. Aluminum is deposited in contact with a substrate and patterned to form an aluminum stud in electrical contact with a conducting element of the substrate. Dielectric is formed over the substrate and the aluminum stud. A trench is formed in the dielectric to expose a top portion of the aluminum stud, and copper is inlaid in the trench in electrical contact with the aluminum stud to form a wiring. The electrically conducting element of the substrate may be a wiring or an element of a semiconductor device. The dielectric may be a single layer of dielectric and may be an organic low-k dielectric.

Related embodiments of the invention pertain to an interconnection structure for an integrated circuit. The structure comprises a substrate that includes a conducting element, and dielectric formed over the substrate. An aluminum stud is disposed within the layer of dielectric in electrical contact with the conducting element. Copper is inlaid in a trench in the dielectric in electrical contact with the aluminum stud to form a wiring. The electrically conducting element of the substrate may be a wiring or an element of a semiconductor device. The dielectric may be a single layer of dielectric and may be an organic low-k dielectric.

BRIEF DESCRIPTION OF THE DRAWINGS

Various preferred embodiments are hereafter described with reference to the accompanying drawings, wherein like numerals denote like elements, and in which:

FIG. 12 shows a first process for forming a connection structure in accordance with embodiments of the invention; and.

DETAILED DESCRIPTION OF PREFERRED EMBODIMENTS

Figure 7:
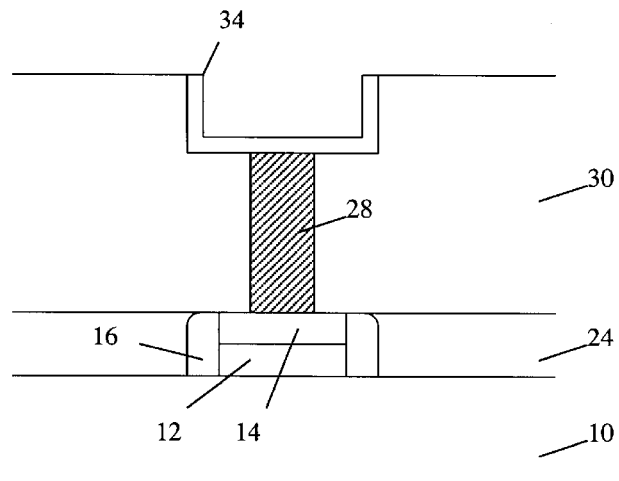
FIG. 7 shows the structure of FIG. 6 after a protective layer is formed in the trench.
Figure 8:
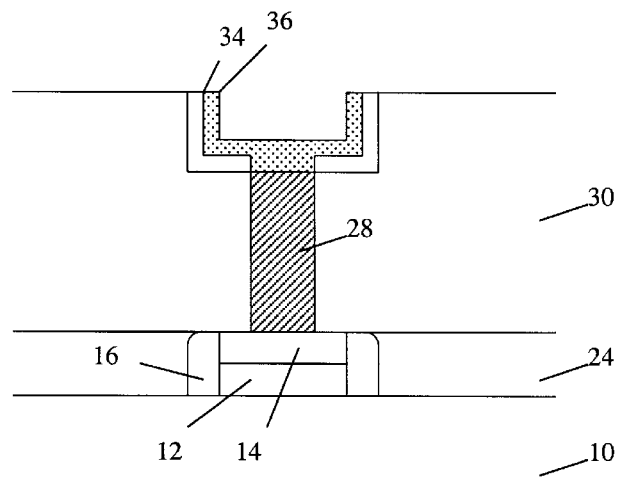
FIG. 8 shows the structure of FIG. 7 after a seed layer is formed over the protective layer.
Figure 9:
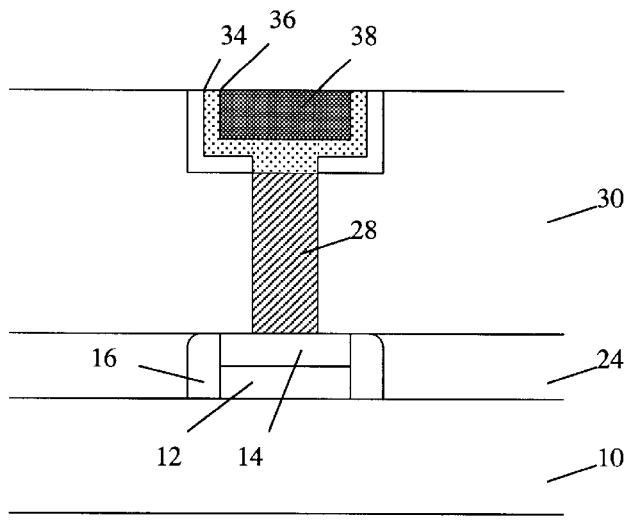
FIG. 9 shows a hybrid copper and aluminum connection structure formed by inlaying copper into the trench of FIG. 8.

FIG. 9 shows a copper and aluminum hybrid connection structure formed in accordance with a first preferred embodiment of the invention, and FIGS. 2 through 8 show intermediate structures formed during processing in accordance with the first preferred embodiment to yield the structure of FIG. 9.

Figure 1:
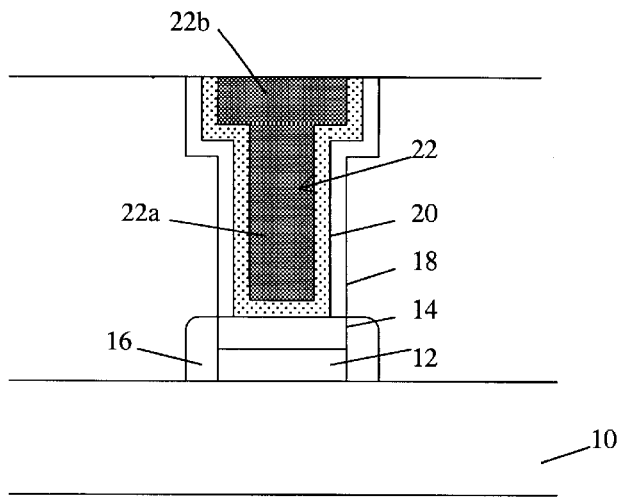
FIG. 1 shows a conventional copper contact and wiring structure.
Figure 2:
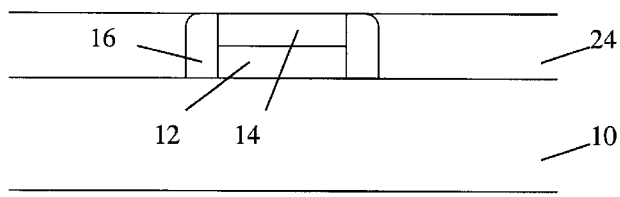
FIG. 2 shows a gate structure with a layer of organic low-k dielectric deposited thereabout.

As shown in FIG. 2, a substrate 10 has formed thereon a gate structure including a gate insulating layer 12, a gate electrode 14, insulating side walls 16, and dielectric 24. In accordance with embodiments of the invention, the term substrate is used herein to refer to a structure upon which or within which there is formed a conductive element. Thus while FIG. 1 shows a gate structure including a gate electrode 14 as a conductive element formed in the substrate, the substrate could alternatively contain a different conductive element of a semiconductor device, such as a diffusion of a MOSFET, or a wiring, a contact or a via.

In FIG. 2, an organic dielectric having a low dielectric constant (hereinafter low-k dielectric) is deposited over the gate structure of FIG. 2 and planarized to form a planarized insulating layer 24. The insulating layer 24 is planarized sufficiently to expose the gate electrode 14.

Figure 3:
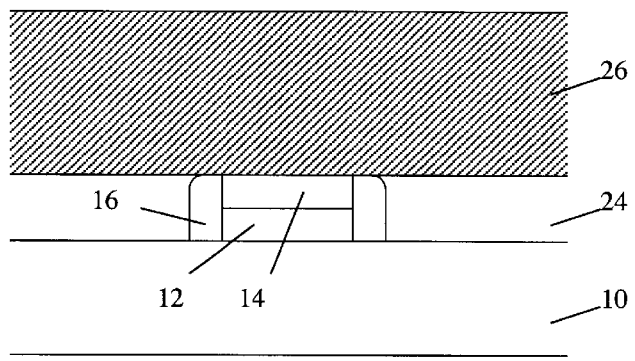
FIG. 3 shows the structure of FIG. 2 with a layer of aluminum deposited thereon.

FIG. 3 shows the structure of FIG. 2 after a layer of aluminum 26 has been deposited thereon. The aluminum may be deposited in any conventional manner, such as by sputtering.

Figure 4:
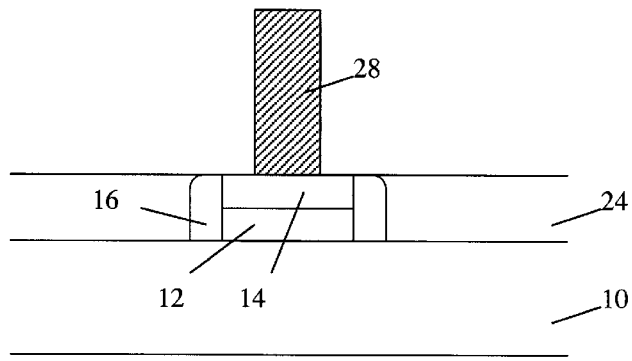
FIG. 4 shows the structure of FIG. 3 after patterning of the aluminum layer to form an aluminum stud.

FIG. 4 shows the structure of FIG. 3 after the aluminum has been patterned to form an aluminum stud 28 in contact with the gate electrode 14. The aluminum may be patterned in any conventional manner, for example, by anisotropic reactive ion etching using a photoresist mask as an etch mask.

Figure 5:
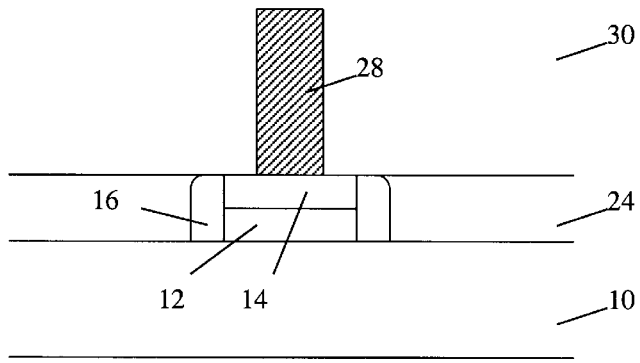
FIG. 5 shows the structure of FIG. 4 after deposition of a layer of organic low-k dielectric thereupon.

FIG. 5 shows the structure of FIG. 4 after deposition and planarization of a layer 30 of organic low-k dielectric over the aluminum stud 28. This may be performed in any conventional manner, such as by using a spin-on organic dielectric. The low-k dielectric may be planarized by polishing. Alternatively, an oxide may be deposited over the low-k dielectric and polished to achieve a planar surface.

It is noted that at this stage the process in accordance with the invention diverges from that of conventional patterning and damascene processes. In conventional processes, an insulating material is deposited over a patterned vertical conducting structure such as the aluminum stud, and is planarized to expose the top of the vertical conducting structure, thus resulting in a surface that is level with the top of the conducting structure. In contrast, in accordance with the invention, the insulating layer 30 is formed to a height that provides sufficient insulating material above the top of the aluminum stud 28 for inlaying metal wiring in contact with the aluminum stud 28.

Figure 6:
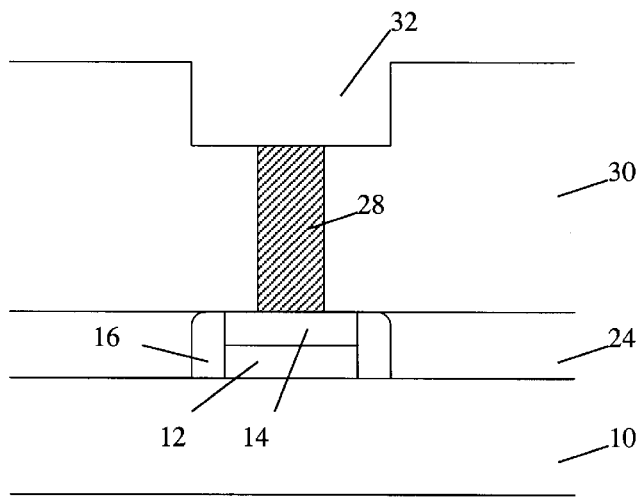
FIG. 6 shows the structure of FIG. 5 after a wiring trench is etched in the low-k dielectric layer.

FIG. 6 shows the structure of FIG. 5 after a wiring trench 32 has been etched in the low-k dielectric layer 30. The trench 32 may be etched using any conventional technique.

FIG. 7 shows the structure of FIG. 6 after a protective layer 34 has been formed in the trench to allow formation of copper wiring in the trench. FIG. 8 shows the structure of FIG. 7 after a copper seed layer 36 has been formed over the protective layer 34. It is seen that the protective layer 34 has been selectively etched to expose the top surface of the aluminum stud 28 prior to formation of the seed layer 36.

FIG. 9 shows the, structure of FIG. 8 after copper has been inlaid in the wiring trench to form copper wiring 38 in electrical contact with the underlying gate electrode 14 through the aluminum stud 28. Copper may be inlaid using any conventional method, such as sputtering of copper followed by chemical mechanical polishing. Thus the final structure as shown in FIG. 9 comprises an aluminum contact 28 joining a copper wiring 38 to a conductive element (the gate electrode 14) of a substrate 10. The copper wiring 38 and the aluminum contact 28 are formed within the single layer of interlayer dielectric 30.

Figure 10:
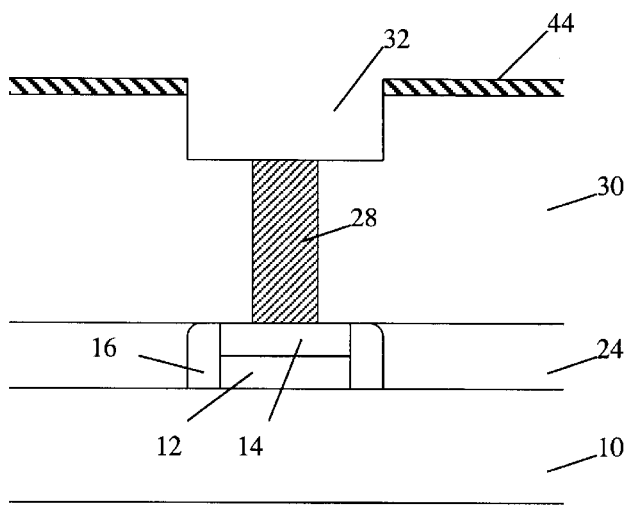
FIG. 10 shows an intermediate structure in the formation of a trench using a hard mask in accordance with a preferred embodiment of the invention.
Figure 11:
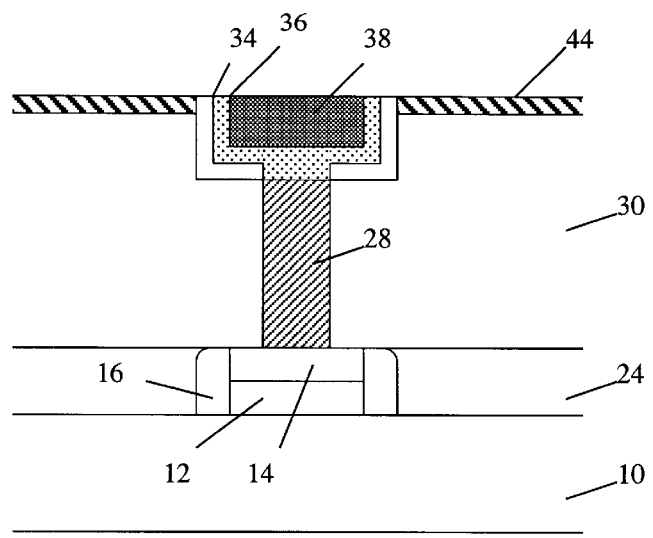
FIG. 11 shows a hybrid copper and aluminum connection structure retaining the hard mask illustrated in FIG. 11.

Although the novel combination of processing tasks described in conjunction with the first preferred embodiment may be implemented using a variety of well-known conventional, techniques, further preferred embodiments employ novel techniques developed by the present inventors. An intermediate structure in accordance with a second preferred embodiment is illustrated in FIG. 10. Briefly summarized, this technique uses a silicon containing organic imaging layer material of the type used in a conventional bi-layer resist to form a hard mask for etching underlying organic low-k dielectric. This structure is shown in FIG. 10, in which a hard mask 44 is formed over the organic low-k dielectric layer 30 and serves as an etch mask for etching the trench 32. The imaging layer material from which the hard mask is formed is any conventional silicon containing organic imaging layer material, such as products OiR620, OiR906 or OiR908 produced by Arch Corporation. The organic imaging layer material is applied in a conventional manner such as spin coating, and is then imaged using projection lithography and developed to form an organic mask. During subsequent etching using $O_2$ plasma, the organic matter of the mask material is eliminated and the silicon of the mask material is converted to silicon oxide, which acts as a hard mask while unmasked organic low-k dielectric is simultaneously etched. Although the hard mask can be removed after etching of the low-k dielectric, it is preferred to leave the hard mask in place. FIG. 11 shows the final structure of a hybrid aluminum and copper connection structure in accordance with the second preferred embodiment in which a hard mask 44 is used to etch the organic low-k dielectric layer 30 and is left in place after etching. The retention of the hard mask 44 is advantageous in that it protects the underlying organic low-k dielectric during chemical mechanical polishing of copper in a subsequent damascene wire formation process.

A third preferred embodiment of the invention also employs a hard mask for etching the organic low-k dielectric. In accordance with the third preferred embodiment, the hard mask is formed in accordance with the techniques disclosed in the co-pending U.S. patent application by the present inventors entitled "Process for Etching an Organic Dielectric Using a Silyated Photoresist Mask," filed Nov. 21, 2000, the entirety of which is incorporated herein by reference. Briefly summarized, this technique forms a hard mask by selectively silyating a silyatable photoresist. The photoresist is applied in a conventional manner such as spin coating, and is then imaged using projection lithography to either enhance the silicon permeability of the hard mask areas or to reduce the silicon permeability of areas to be removed, in accordance with the particular photoresist chemistry. The photoresist is then selectively silyated through exposure to a wet or dry silyation chemistry. During subsequent etching using $O_2$ plasma, the organic matter of the photoresist is eliminated and the silicon in the silyated areas of the photoresist is converted to silicon oxide, which acts as a hard mask while unmasked organic low-k dielectric is simultaneously etched. As in the second preferred embodiment, it is preferable to retain the hard mask after etching to protect the underlying organic low-k dielectric.

Those having ordinary skill in the art will recognize a variety of alternatives to the first preferred embodiment illustrated in FIGS. 2 through 9. For example, while the first preferred embodiment involves the formation of a contact and wiring connecting to an element of a semiconductor device, alternative embodiments of the invention may form a via and wiring for connecting to another wiring. Other metals and dielectrics may be also be substituted for those of the preferred embodiments.

Figure 12:
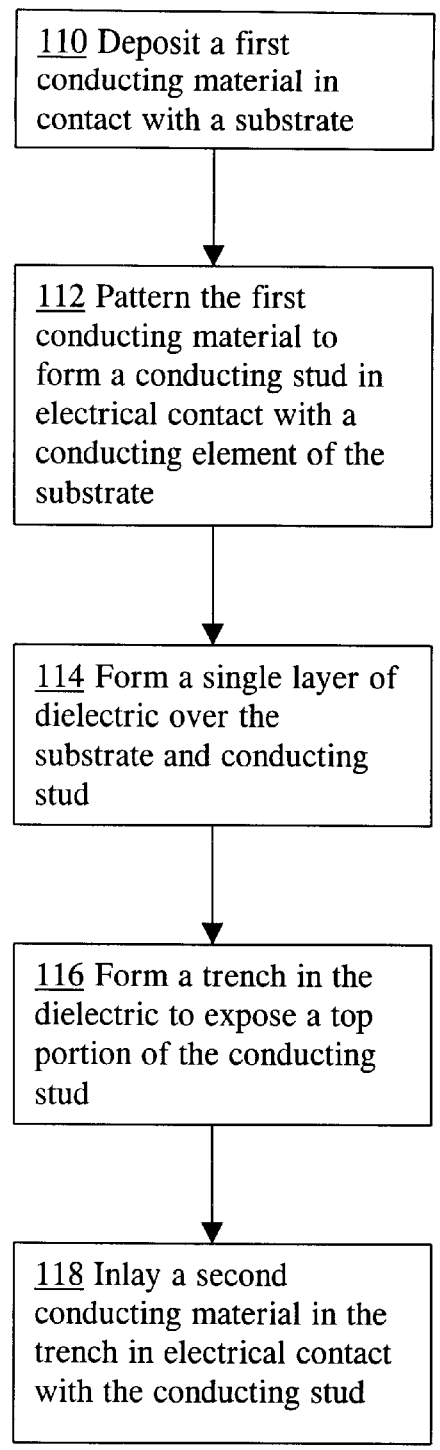

Embodiments of the invention are therefore applicable to a variety of structures in which it is desired to form a wiring and a contact or via for connecting to an underlying conducting element. A first basic process in accordance with embodiments of the invention is illustrated in FIG. 12. Initially, a first conducting material is deposited (110) in contact with a substrate. The substrate includes a conducting element such as a conducting element of a semiconductor device, or a contact, via, or wiring. The substrate may also include a dielectric formed thereon to provide a planar surface, such as the dielectric 24 illustrated in FIGS. 2–11.

After the first conducting material is deposited (110), the first conducting material is patterned (112) to form a conducting stud in electrical contact with a conducting element of the substrate. Patterning may be performed in any conventional manner such as by etching using an etch mask. A single layer of dielectric is then formed (114) over the substrate and the conducting stud. The single layer of dielectric is formed to a height sufficient to enable metal wiring to be inlaid in the dielectric in contact with the conducting stud. A trench is then formed (116) in the dielectric to expose a top portion of the conducting stud, and a second conducting material is inlaid (118) in the trench in electrical contact with the conducting stud to form a wiring. While in the preferred embodiments the first and second conducting materials of the conducting stud and wiring are aluminum and copper, respectively, other conducting materials may also be used, and the first and second materials of the stud and wiring may be the same material.

Figure 13:
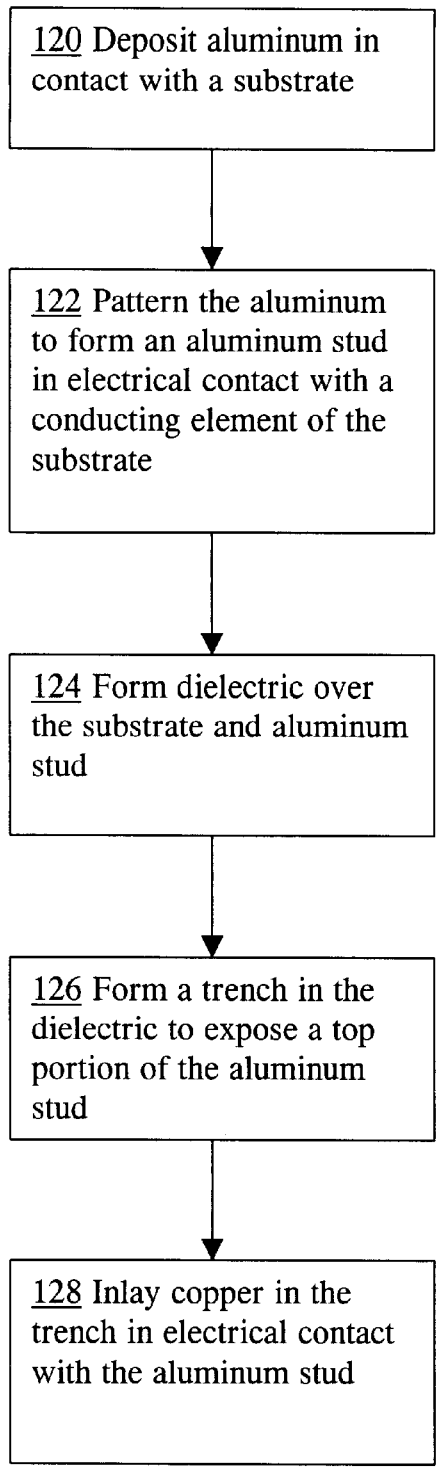
FIG. 13 shows a second process for forming a connection structure in accordance with embodiments of the invention.

A second basic process in accordance with embodiments of the invention is illustrated in FIG. 13. Initially, aluminum is deposited (120) in contact with a substrate. The substrate includes a conducting element such as a conducting element of a semiconductor device, or a contact, via, or wiring. The substrate may also include a dielectric formed thereon to provide a planar surface, such as the dielectric 24 illustrated in FIGS. 2–11.

The aluminum is then patterned (122) to form an aluminum stud in electrical contact with a conducting element of the substrate. Patterning may be performed in any conventional manner such as by etching using an etch mask. Dielectric is then formed (124) over the substrate and the aluminum stud. The dielectric is formed to a height sufficient to enable metal wiring to be inlaid in the dielectric in contact with the aluminum stud. A trench is the formed (126) in the top surface of the dielectric to expose a top portion of the aluminum stud, and copper is inlaid (128) to form copper wiring in electrical contact with the aluminum stud. While in the preferred embodiments the dielectric comprises a single layer of organic low-k dielectric, other dielectrics may be used and multiple layers of dielectrics may be used.

While the preferred embodiments of the invention have been illustrated and described, those skilled in the art will recognize various changes and modifications that may be made to yield alternative embodiments, for example, by substituting equivalent materials, structures or processing tasks for those disclosed herein, by employing additional materials, structures or processing tasks, or by adaptation to a particular situation. Therefore a variety of embodiments in addition to those disclosed herein are encompassed by the appended claims.

What is claimed is:

1. An interconnection structure for an integrated circuit comprising:
    a substrate including a conducting element;
    a single layer of organic low-k dielectric formed over the substrate;
    a conducting stud disposed within the single layer of organic low-k dielectric in electrical contact with the conducting element; and
    a wiring inlaid in a trench in the single layer of organic low-k dielectric in electrical contact with the conducting stud.

2. The interconnection structure claimed in claim 1, wherein the conducting stud and the wiring are separately formed structures.

3. The interconnection structure claimed in claim 1, wherein the conducting stud is formed of aluminum.

4. The interconnection structure claimed in claim 1, wherein the wiring is formed of copper.

5. The interconnection structure claimed in claim 1, wherein the conducting stud is formed of aluminum and the wiring is formed of copper.

6. The interconnection structure claimed in claim 1, wherein the substrate includes a dielectric material at a surface of the substrate on which the single layer of dielectric is formed.

7. The interconnection structure claimed in claim 1, further comprising a hardmask layer overlying the organic low-k dielectric layer, and wherein the wiring is inlaid in a trench in the hardmask layer and the organic low-k dielectric layer.

8. The interconnection structure claimed in claim 2, further comprising:

a protective layer formed in the trench; and a copper seed layer formed over the protective layer, and wherein said wiring is formed of copper inlaid in the trench in contact with the copper seed layer.

9. The interconnection structure claimed in claim 2, wherein the conducting element of the substrate comprises an element of a discrete semiconductor device, and wherein the conducting stud comprises a contact.

10. The interconnection structure claimed in claim 2, wherein the conducting element of the substrate comprises a wiring, and wherein the conducting stud comprises a via.

11. An interconnection structure for an integrated circuit comprising:

a substrate including a conducting element;

a single layer of organic low-k dielectric formed over the substrate;

an aluminum stud disposed within the single layer of organic low-k dielectric in electrical contact with the conducting element; and a copper wiring inlaid in a trench in the single layer of organic low-k dielectric in electrical contact with the aluminum stud.

12. The interconnection structure claimed in claim 11, wherein the conducting stud and the wiring are separately formed structures.

13. The interconnection structure claimed in claim 11, further comprising a hardmask layer overlying the organic low-k dielectric layer, and wherein the wiring is inlaid in a trench in the hardmask layer and the organic low-k dielectric layer.

14. The interconnection structure claimed in claim 12, wherein the substrate includes a dielectric material at a surface of the substrate on which the single layer of organic low-k dielectric is formed.

15. The interconnection structure claimed in claim 12, further comprising:

a protective layer formed in the trench; and a copper seed layer formed over the protective layer, and wherein said copper wiring is inlaid in the trench in contact with the copper seed layer.

16. The interconnection structure claimed in claim 12, wherein the conducting element of the substrate comprises an element of a discrete semiconductor device, and wherein the aluminum stud comprises a contact.

17. The interconnection structure claimed in claim 12, wherein the conducting element of the substrate comprises a wiring, and wherein the aluminum stud comprises a via.

* * * * *